United States Patent [19]

Nazarian et al.

[11] 4,160,918
[45] Jul. 10, 1979

[54] INTEGRATED LOGIC CIRCUIT

[76] Inventors: Artashes R. Nazarian, ploschad Junosti, 3, kv. 16; Vyacheslav Y. Kremlev, korpus 423, kv. 81; Vilyam N. Kokin, korpus 441, kv. 115; Nikolai M. Manzha, korpus 401, kv. 49, all of Moscow, U.S.S.R.

[21] Appl. No.: 865,362

[22] Filed: Dec. 29, 1977

[30] Foreign Application Priority Data

Jan. 6, 1977 [SU] U.S.S.R. .............................. 2438345

[51] Int. Cl.² .................... H03K 19/08; H03K 19/12; H03K 19/34
[52] U.S. Cl. .................................. 307/205; 307/213; 307/215; 307/299 B; 307/317 A; 357/92
[58] Field of Search ............... 307/203, 205, 213, 214, 307/215, 317 A, 299 B; 357/92

[56] References Cited

U.S. PATENT DOCUMENTS

| 3,816,758 | 6/1974 | Berger et al. | 357/92 X |
|---|---|---|---|
| 3,916,218 | 10/1975 | Berger et al. | 357/92 X |
| 4,009,397 | 2/1977 | Mulder et al. | 357/92 X |
| 4,035,664 | 7/1977 | Berger et al. | 357/92 X |
| 4,053,923 | 10/1977 | Kang | 357/92 X |

FOREIGN PATENT DOCUMENTS 1358287 7/1974 United Kingdom ..................... 307/213
597094 0000 U.S.S.R.

OTHER PUBLICATIONS

*Electronics* (pub.) pp. 4E & 6E; 8/19/76.
Berger et al., "Advanced Merged Transistor Logic by Using Schottky Junctions"; *Microelectronics*, vol. 7, No. 3, 1976; pp. 35-42.
Norton, "'More on' Circuit"; *IBM Technical Discl. Bull.;* vol. 18, No. 9, pp. 2788-2789; 2/76.
Berger et al.; "Improving Switching Speed of MTL/I²L Circuitry"; *IBM Technical Discl. Bull.;* vol. 19, No. 7, pp. 2575-2577; 12/76.

*Primary Examiner*—Larry N. Anagnos
*Attorney, Agent, or Firm*—Lackenbach, Lilling & Siegel

[57] ABSTRACT

An integrated injection logic circuit comprises a switching element using a unipolar FET whose gates are connected to the collectors of a load transistor. The emitter of the load transistor is connected to a power supply and the base area is combined with the source of the unipolar FET and grounded. Connected to the gates of the unipolar FET and to the base area of the load transistor are double-pole gating elements. The number of such elements is equal to the number of gates of the unipolar FET. The conduction voltage of the gating elements is lower than that across the p-n junctions of the respective gates of the unipolar FET.

8 Claims, 1 Drawing Figure

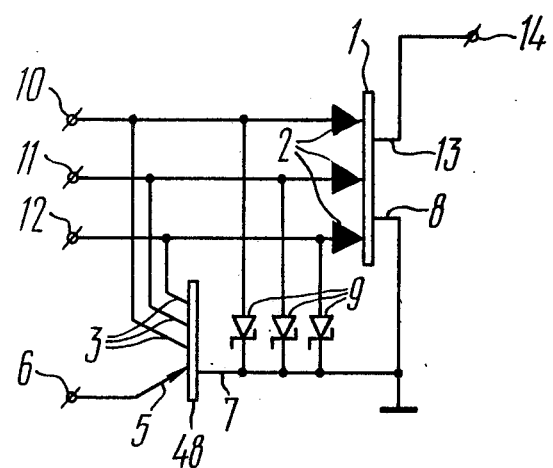

INTEGRATED LOGIC CIRCUIT

FIELD OF THE INVENTION

The present invention relates to microelectronics and in particular to integrated injection logic circuits.

The invention may successfully be used in digital computing equipment, such as microprocessors.

DESCRIPTION OF THE PRIOR ART

In the prior art there are known integrated injection logic ($I^2L$) circuits comprising a switching element made as a transistor wherein the base area is connected to the collectors of a load transistor having its emitter connected to a power supply and its base area combined with the emitter of the switching transistor element and grounded (see, for instance, British Pat. No. 1358287).

Integrated circuits of this kind suffer from a low speed of operation which is attributable to the build-up of a minority carrier excess charge in the base area of the switching transistor element and to rather high values of the emitter and collector p-n junction capacitances.

Also known in the art are $I^2L$ circuits comprising a switching element made as an n-p-n bipolar transistor connected in parallel with an n-channel field-effect transistor having a control p-n junction (see, for instance, U.S.S.R. Author's certificate No. 597094).

This arrangement of an $I^2L$ circuit results in a moderate speed of operation, which is due to a build-up of a minority carrier charge in the source area of the unipolar FET when the gate p-n junction is fed with high forward bias voltages.

BRIEF DESCRIPTION OF THE INVENTION

The object of the present invention is to increase the speed of operation of $I^2L$ circuits.

The essence of the invention consists in designing an integrated injection logic circuit which comprises a switching element made as a unipolar FET having its gates connected to the collectors of a load transistor, whose emitter is connected to a power supply and whose base area is combined with the source of the unipolar FET and grounded. According to the invention, double-pole gating elements are included, the number of which is equal to the number of gates of the unipolar FET, which are connected to the gates of the unipolar FET and to the base area of the load transistor, the conduction voltage of these gating elements being lower than that of the p-n junctions of respective unipolar FET gates.

This design of an $I^2L$ circuit substantially increases its speed of operation by a simple means without undue complication of the circuit manufacturing procedure.

BRIEF DESCRIPTION OF DRAWING

The above and other objects of the invention will be made clear from the following description of its embodiment given by way of example and shown in the accompanying drawing which presents a schematic electrical diagram of the integrated injection logic according to the invention.

DETAILED DESCRIPTION OF THE INVENTION

The integrated injection logic circuit, according to the invention, will be described in what follows as a design of a NOR circuit.

The $I^2L$ circuit, according to the invention, comprises a switching element using a unipolar FET 1 with an n-type conduction channel. Gates 2 of the unipolar FET are connected to collectors 3 of a load transistor 4 represented by a bipolar p-n-p transistor having its emitter 5 connected to a power supply 6 (shown in the drawing as a terminal). A base area 7 of the load transistor 4 is combined with a source 8 of the unipolar FET 1 and grounded.

The $I^2L$ circuit, according to the invention, also comprises double-pole gating elements 9 connected to the gates 2 of the unipolar FET 1 and to the base area 7 of the load transistor 4. The number of the gating element 9 is equal to the number of gates 2 of the unipolar transistor 1. The conduction voltage (a forward voltage drop) of the gating elements 9 is lower than that of p-n junctions of the respective gates 2 of the unipolar FET 1. Every gating element 9 uses a Schottky diode. Any non-injection junction may also be used for the purpose.

The gates 2 of the unipolar FET 1 serve as inputs 10, 11 and 12 of the $I^2L$ circuit according to the invention, while its drain 13 performs the functions of an output 14 thereof.

The $I^2L$ circuit, according to the invention, operates as follows.

When a logical "0" signal (a low positive voltage of 0 to 0.2 V) is applied to the inputs 10, 11 and 12 of the circuit, the unipolar FET 1 will be cut-off and the output 14 will have a logical "1" signal (if the output 14 of the present circuit is connected to the input of a similar circuit, the voltage level of a logical "1" signal will be equal to a forward voltage drop of 0.3 to 0.6 V across the junction of the gating element). If at least one of the inputs, for instance, the input 10, is fed with a logical "1" signal, the circuit supply current will flow, via a respective collector 3, to the gate 2 of the unipolar FET 1 and to a respective gating element 9 connected to it. The unipolar FET 1 will start conducting and its output 14 will produce a logical "0" signal. At the same time the gate-source p-n junction and the metal-semiconductor junction of the gating element 9 become forward biased. Since the conduction voltage (or the forward voltage drop) of the gating element 9 is lower than that of the gate-source p-n junction, the current flowing through the p-n junction in this case will be much weaker than that of the power supply.

Operation of the gating elements 9 results in the limiting the voltage across the gate-source p-n junction as well as in a supply current redistribution between the gate-source p-n junction and the metal-semiconductor junction. In this case the share of the current generated by minority carrier injection into the source area will be reduced. Hence, the charge stored in the source area of the unipolar FET 1 will also decrease.

Major advantages of the $I^2L$ circuit according to the invention will become evident in a most effective manner when it is manufactured by means of the planar technology. The circuit production procedure is quite simple. It requires only four photomasks and consists in only two impurity diffusion operations. Not only does the proposed circuit preserve all the advantages of integrated injection logic devices, but it exceeds them considerably in the speed of operation. The delay-by-dissipation power product of this circuit is in the range of several hundredths of a picojoule.

What is claimed is:

1. An integrated injection logic circuit comprising:

a switching element having a unipolar FET with a plurality of gates, a source and a drain, said gates serving as inputs of said logic circuit and said drain serving as an output of said circuit;

a load transistor having a plurality of collectors, an emitter and a base area, said transistor having its collectors connected to respective gates of said unipolar FET and said base area combined with said source of said unipolar FET and grounded;

a power supply connected to said emitter of said load transistor;

a plurality of double-pole gating elements connected to said gates of said unipolar FET and to said base area of said load transistor, the conduction voltage of said gating elements being lower than that across p-n junctions of respective gates of said unipolar FET.

2. An integrated injection logic circuit according to claim 1, wherein said load transistor is a bipolar p-n-p transistor.

3. An integrated injection logic circuit according to claim 2, wherein said unipolar FET includes an n-type conduction channel.

4. An integrated injection logic circuit according to claim 3, wherein said double-pole gating elements are Schottky diodes.

5. An integrated injection logic circuit according to claim 2, wherein said double-pole gating elements are Schottky diodes.

6. An integrated injection logic circuit according to claim 1, wherein said unipolar FET includes an n-type conduction channel.

7. An integrated injection logic circuit according to claim 6, wherein said double-pole gating elements are Schottky diodes.

8. An integrated injection logic circuit according to claim 1, wherein said double-pole gating elements are Schottky diodes.

* * * * *